United States Patent
Saeki et al.

(10) Patent No.: US 6,846,686 B2
(45) Date of Patent: Jan. 25, 2005

(54) SEMICONDUCTOR LIGHT-EMITTING DEVICE AND METHOD OF MANUFACTURING THE SAME

(75) Inventors: Ryo Saeki, Tokyo (JP); Hideto Sugawara, Kawasaki (JP); Yukio Watanabe, Yokohama (JP); Tamotsu Jitosho, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 92 days.

(21) Appl. No.: 10/429,462

(22) Filed: May 5, 2003

(65) Prior Publication Data

US 2003/0201449 A1 Oct. 30, 2003

Related U.S. Application Data

(62) Division of application No. 10/001,083, filed on Oct. 31, 2001, now Pat. No. 6,586,773.

(30) Foreign Application Priority Data

Oct. 31, 2000 (JP) .................................. 2000-333586
Mar. 8, 2001 (JP) .................................. 2001-065426

(51) Int. Cl.$^7$ .............................................. H01L 21/00
(52) U.S. Cl. ....................... 438/22; 438/438; 438/459; 438/603
(58) Field of Search ..................... 438/22–47, 455–464, 438/597–604

(56) References Cited

U.S. PATENT DOCUMENTS

| | | | |
|---|---|---|---|
| 5,297,158 A | | 3/1994 | Naitou et al. |
| 5,306,950 A | | 4/1994 | Fujikawa et al. |
| 5,376,580 A | * | 12/1994 | Kish et al. ..................... 438/26 |
| 5,488,235 A | * | 1/1996 | Nozaki et al. ................. 257/94 |
| 5,783,477 A | * | 7/1998 | Kish et al. ................... 438/455 |
| 5,920,766 A | * | 7/1999 | Floyd .......................... 438/35 |
| 6,107,648 A | * | 8/2000 | Shakuda et al. ............. 257/103 |
| 6,121,127 A | | 9/2000 | Shibata et al. |
| 6,258,699 B1 | | 7/2001 | Chang et al. |
| 6,343,163 B1 | | 1/2002 | Kawanishi |
| 6,384,430 B1 | | 5/2002 | Nakatsu et al. |
| 6,395,572 B1 | | 5/2002 | Tsutsui et al. |
| 6,433,364 B2 | * | 8/2002 | Hosoba et al. ................ 257/80 |
| 6,465,809 B1 | * | 10/2002 | Furukawa et al. ............ 257/94 |
| 6,528,823 B2 | * | 3/2003 | Akaike et al. ................ 257/79 |
| 2001/0016366 A1 | * | 8/2001 | Sasaki et al. ................. 438/24 |
| 2001/0042866 A1 | | 11/2001 | Coman et al. |

FOREIGN PATENT DOCUMENTS

JP  08-213657  8/1996

OTHER PUBLICATIONS

Shoou–Jinn Chang et al., "AlGaInP / GaP Light–Emitting Diodes Fabricated by Wafer Direct Bonding Technology", Jpn. J Appl. Phys. vol. 35 (1996) pp. 4199–4202.

F.A. Kish et al., "Very High–Efficiency Semiconductor Wafer–Bonded Transparent–Substrate ($Al_xGa_{1-x})_{0.5}In_{0.5}P$/GaP Light Emitting Diodes", Appl. Phys. Lett. vol. 64 No. 21 (1994) pp. 2839–2841.

* cited by examiner

Primary Examiner—Savitri Mulpuri
(74) Attorney, Agent, or Firm—Hogan & Hartson, LLP (57) ABSTRACT

A semiconductor light-emitting device, including a first substrate of a first conductivity type, a first bonding layer provided on the first substrate and consisting essentially of a GaP material of the first conductivity type, a second bonding layer provided on the first bonding layer, coincident with the first bonding layer in the planar direction of the crystal, having the first conductivity type, and consisting essentially of a material represented by a formula $In_xGa_yP$, where $0 \leq x$, $y \leq 1$, and $x+y=1$, and a light-emitting layer comprising a first cladding layer, an active layer, and a second cladding layer, which are successively provided on the second bonding layer, each of the active layer and first and second cladding layers consisting essentially of a material represented by a formula $In_xGa_yAl_zP$, where $x+y+z=1$, and $0 \leq x$, $y$, $z \leq 1$.

9 Claims, 10 Drawing Sheets

|  | Red | Yellow |
|---|---|---|
| First prior art | 8.0 | 6.5 |
| Second prior art | 15 | 9 |
| First embodiment | 16 | 11 |
| Second embodiment | 20 | 16 |
| Third embodiment | 24 | 24 |

| Material | Carrier concentration ($cm^{-3}$) | Resistivity ($\Omega cm$) |
|---|---|---|
| p-GaAlAs | $3 \times 10^{17}$ | 0.18 |
| p-InGaAlP | $3 \times 10^{17}$ | 2.0 |

F I G. 12

| | Material | Carrier concentration ($cm^{-3}$) | Resistivity ($\Omega cm$) |
|---|---|---|---|
| First embodiment | n-GaAlAP | $4 \times 10^{17}$ | 0.04 |
| Fourth embodiment | p-InGaAlP | $3 \times 10^{17}$ | 2.0 |

SEMICONDUCTOR LIGHT-EMITTING DEVICE AND METHOD OF MANUFACTURING THE SAME

This application is a division of application Ser. No. 10/001,083, filed Oct. 31, 2001, now U.S. Pat. No. 6,586,773.

CROSS-REFERENCE TO RELATED APPLICATIONS

This application is based upon and claims the benefit of priority from the prior Japanese Patent Applications No. 2000-333586, filed Oct. 31, 2000, and No. 2001-065426, filed Mar. 8, 2001, the entire contents of both of which are incorporated herein by reference.

BACKGROUND OF THE INVENTION

1. Field of the Invention

The present invention relates to, for example, a semiconductor light-emitting device and a method of manufacturing the same, particularly, to a semiconductor light-emitting device using an InGaAlP material and a method of manufacturing the same.

2. Description of Related Art

A semiconductor light-emitting device such as an LED (light-emitting diode) comprises a light-emitting layer, and light is emitted from the light-emitting layer in accordance with the voltage applied from the electrodes on both sides of the light-emitting device. In order to improve the light-emitting efficiency of the light-emitting device, it is necessary to prevent the light emitted from the light-emitting layer from being reflected and absorbed within the device.

In general, an n-type GaAs is used as a substrate of an LED using an InGaAlP series material.

Figure 15:
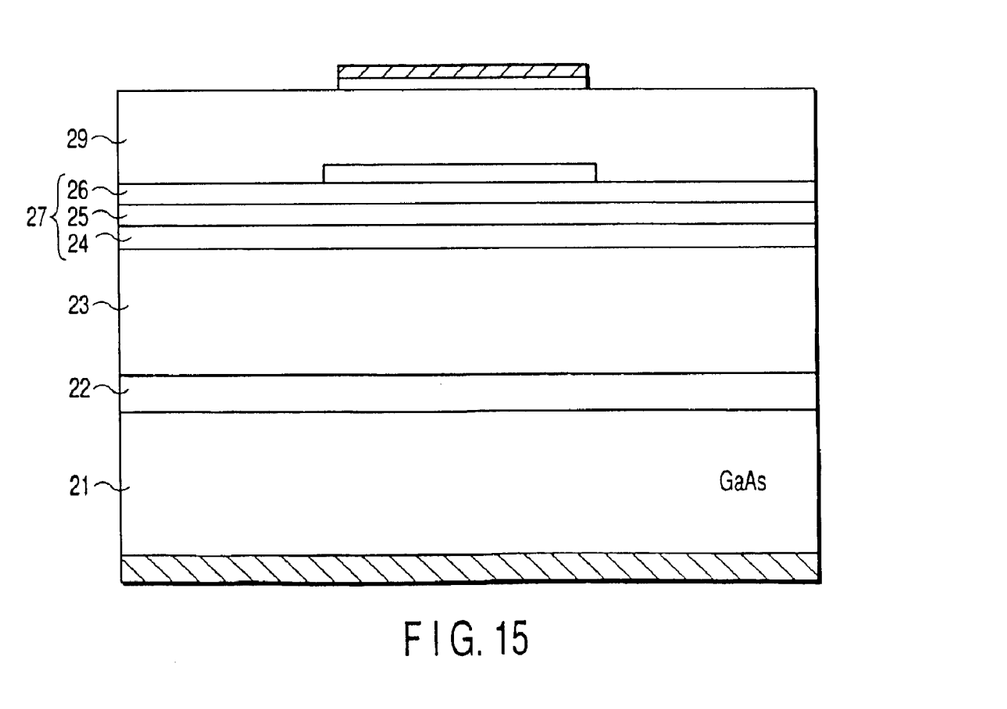
FIG. 15 is a cross sectional view showing the construction of a semiconductor light-emitting device according to a first prior art.

FIG. 15 shows a first prior art of a semiconductor light-emitting device using the material noted above. As shown in the drawing, a buffer layer 22 is formed on a GaAs substrate 21, and a light reflecting layer 23 is formed on the buffer layer 22. Also, a light-emitting layer comprising an n-cladding layer 24, an active layer 25 and a p-cladding layer 26 is formed on the light reflecting layer 23. Further, a p-GaAlAs current diffusion layer 29 is formed on the light-emitting layer 27.

It should be noted that the GaAs substrate 21 is not transparent to a visible light and, thus, the light emitted from the light-emitting layer and running downward is absorbed entirely by the GaAs substrate 21. This is a serious obstacle to the improvement in the brightness of the LED.

Figure 16:
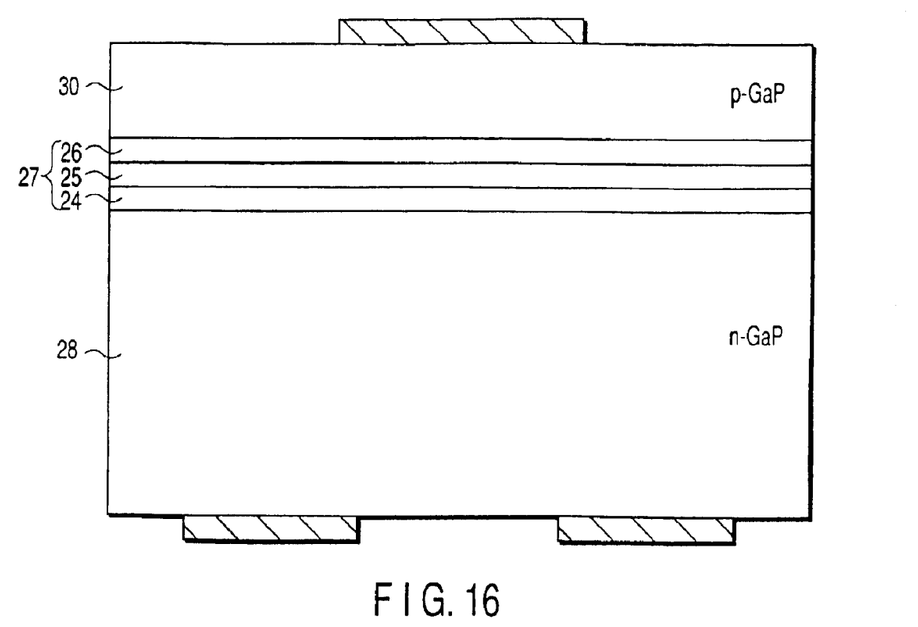
FIG. 16 is a cross sectional view showing the construction of a semiconductor light-emitting device according to a second prior art.

Such being the situation, proposed is a method of using a GaP substrate as the substrate of the semiconductor light-emitting device. FIG. 16 shows a second prior art of a semiconductor light-emitting device. In the second prior art, a light-emitting layer 27 is formed by a MOCVD method (Metal Organic Chemical Vapor Deposition method) on a GaAs substrate (not shown), followed by forming a thick p-type GaP layer 30 by an HVPE method (Hydride Vapor Phase Epitaxy method) having a thickness of 50 μm on the light-emitting layer 27, as shown in FIG. 16. Further, the GaAs substrate is removed, and an n-type GaP substrate 28 transparent to a visible light is bonded to the light-emitting layer 27 in place of the n-type GaAs substrate. In the semiconductor light-emitting device of the particular construction, the light emitted from the light-emitting layer 27 is taken out upward, downward, rightward and leftward, i.e., in every direction. It follows that it is possible to obtain the brightness of the light emission 2 to 3 times as high as that in the first prior art.

It should be noted, however, that, in bonding the GaP substrate 28 to the light-emitting layer 27 in the light-emitting device of the construction shown in FIG. 16, it is necessary to apply a heat treatment at a temperature higher than the heat treating temperature for the MOCVD step (about 700° C.). It follows that the light-emitting layer 27 receives a thermal damage in the bonding process of the GaP substrate 28. Particularly, where zinc is used as the p-type impurity of the p-cladding layer 26, zinc is diffused in a large amount into the active layer 25 in the step of the heat treatment at a high temperature so as to deteriorate the crystallinity of the active layer 25. As a result, the power of the light emitted from the light-emitting layer 27 included in the second prior art is rendered markedly inferior to that in the first prior art. It follows that the brightness in the second prior art fails to reach a level that is 2 times as high as that in the first prior art.

Under the circumstances, it is conceivable to lower the heat treating temperature in the bonding step in order to avoid the damage done to the light-emitting layer by the heat. In this method, however, a satisfactory ohmic contact fails to be formed at the bonding interface between the n-cladding layer 25 and the GaP substrate 28, resulting in elevation of the operating voltage of the light-emitting device.

Figure 17:
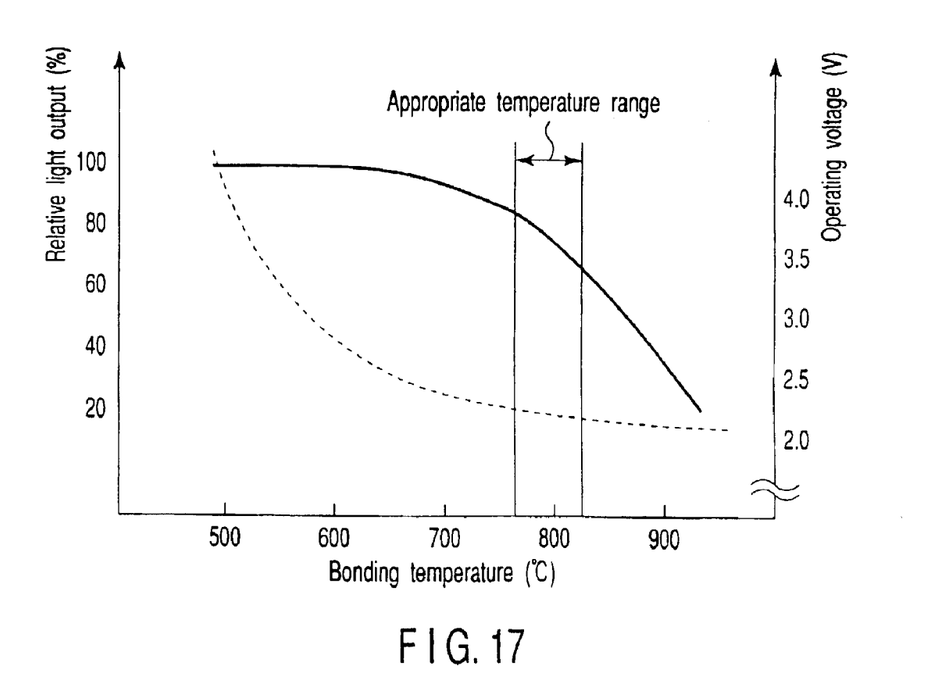
FIG. 17 is a graph showing the relationship between the bonding temperature and the operating voltage and the relationship between the bonding temperature and the relative light output in respect of the semiconductor light-emitting device shown in FIG. 15.

FIG. 17 is a graph showing the relationship between the heat treating temperature in the bonding step and the relative light output of the device and the relationship between the heat treating temperature in the bonding step and the operating voltage. In the graph of FIG. 17, the relationship between the bonding temperature and the relative light output is denoted by a solid line, and the relationship between the bonding temperature and the operating voltage is denoted by a broken line. As apparent from the broken line given in FIG. 17, the operating voltage is lowered with increase in the heat treating temperature in the bonding step. It should be noted that a satisfactory ohmic contact can be obtained at about 800° C. On the other hand, the light output of the device is lowered with increase in the heat treating temperature as apparent from the solid line given in FIG. 17. It follows that, in order to obtain a reasonable level of the light output of the device and to lower the operating voltage of the device, it is necessary to select the heat treating temperature in the bonding step falling within an appropriate temperature range. The appropriate temperature range is very narrow (about 790° C. to 810° C.), leading to the problems that it is impossible to obtain a sufficient effect of improving the light output, which is to be obtained by the bonding of the transparent GaP substrate 28, and that it is difficult to produce the semiconductor light emitting device stably with a high yield.

BRIEF SUMMARY OF THE INVENTION

According to a first aspect of the present invention, there is provided a semiconductor light-emitting device, comprising a first substrate of a first conductivity type; a first bonding layer provided on the first substrate and consisting essentially of a GaP material of the first conductivity type; a second bonding layer provided on the first bonding layer, coincident with the first bonding layer in the planar direction of the crystal, having the first conductivity type, and consisting essentially of a material represented by a general formula $In_xGa_yP$, where $0 \leq x$, $y \leq 1$, and $x+y=1$; and a light-emitting layer comprising a first cladding layer, an active layer, and a second cladding layer, which are successively provided on the second bonding layer, each of the first and second cladding layers having the first and a second conductivity types, and each of the active layer and first and second cladding layers consisting essentially of a material represented by a general formula $In_xGa_yAl_zP$, where $x+y+z=1$, and $0 \leq x, y, z \leq 1$.

According to a second aspect of the present invention, there is provided a method of manufacturing a semiconductor light-emitting device, comprising forming a first semiconductor layer including formation of a buffer layer of a second conductivity type on a second substrate of the second conductivity type, formation of a current diffusion layer of the second conductivity type on the buffer layer, formation of a second cladding layer of the second conductivity type on the current diffusion layer, formation of an active layer on the second cladding layer, formation of a first cladding layer of a first conductivity type on the active layer, and formation of a second bonding layer of the first conductivity type on the first cladding layer, each of the second substrate and the buffer layer consisting essentially of a GaAs material, each of the current diffusion layer, the active layer and the first and second cladding layers consisting essentially of a material represented by a general formula $In_xGa_yAl_zP$, where $x+y+z=1$, and $0 \leq x, y, z \leq 1$, and the second bonding layer consisting essentially of an InGaP material; forming a second semiconductor layer including formation of a first bonding layer of the first conductivity type on a first substrate of the first conductivity type, each of the first substrate and the first bonding layer consisting essentially of a GaP material; bonding the first semiconductor layer to the second semiconductor layer with the first bonding layer and the second bonding layer forming a bonding interface; and removing the second substrate and buffer layer.

DETAILED DESCRIPTION OF THE INVENTION (First Embodiment)

Figure 1:
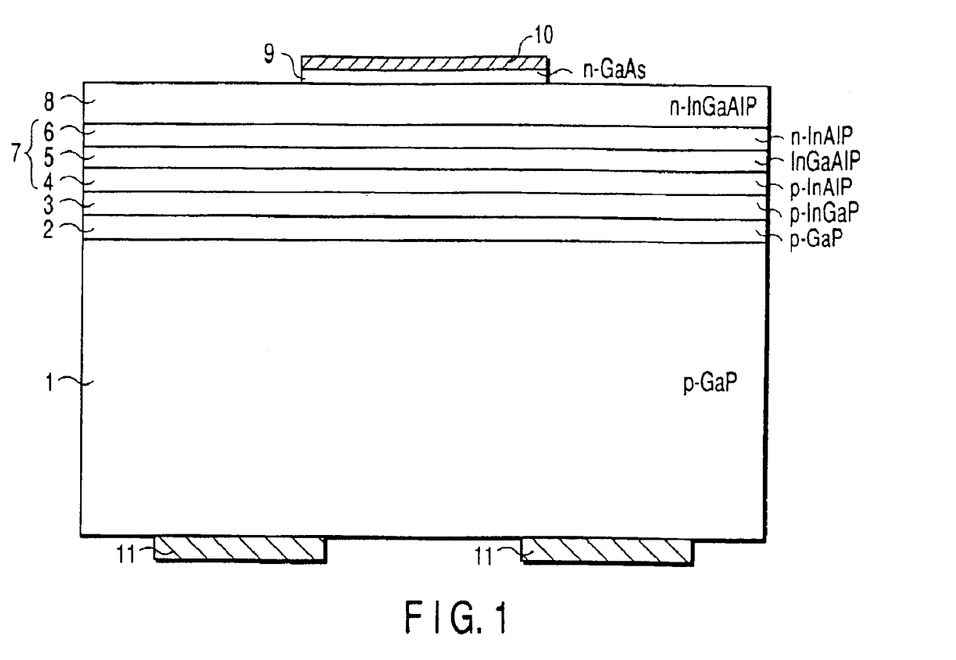
FIG. 1 is a cross sectional view showing a semiconductor light-emitting device according to a first embodiment of the present invention.

FIG. 1 is a cross sectional view schematically showing the construction of a semiconductor light-emitting device according to a first embodiment of the present invention. As shown in the drawing, the semiconductor light-emitting device comprises a p-type GaP substrate 1 having a thickness of 250 $\mu$m. The p-type GaP substrate 1 has a planar direction inclining by 7 to 16° from the (−100) plane toward the [0-1-1] direction. Incidentally, the [0-1-1] direction differs from the [011] direction by 180°. Formed on the p-type GaP substrate 1 are a first bonding layer 2 formed of p-type GaP layer having a thickness of, for example, 0.5 $\mu$m and a second bonding layer 3 formed of a p-type InGaP layer having a thickness of, for example, 0.03 to 0.1 $\mu$m. The first bonding layer 2 and the second bonding layer 3 are formed for the bonding to other layers described herein later.

Formed successively on the second bonding layer 3 are a p-type cladding layer 4 consisting of a p-type InAlP layer, an active layer 5 consisting of an InGaAlP layer, and an n-type cladding layer 6 consisting of an n-type InAlP layer. The p-type cladding layer 4 has a thickness of, for example, 1.0 $\mu$m, the active layer 5 has a thickness of, for example, 0.6 $\mu$m, and the n-type cladding layer 6 has a thickness of, for example, 0.6 $\mu$m. These p-type cladding layer 4, active layer 5 and n-type cladding layer 6 collectively form a light-emitting layer 7 of a double hetero structure.

A current diffusion layer 8 consisting of an n-type InGaAlP layer having a thickness of, for example, 1.5 $\mu$m is formed on the n-type cladding layer 6. The current supplied from the electrode described herein later is diffused in the current diffusion layer 8 so as to allow the light-emitting layer 7 to emit light efficiently.

A contact layer 9 consisting of an n-type GaAs layer having a thickness of, for example, 0.1 μm is formed on the current diffusion layer 8, and a front surface electrode 10 of, for example, a AuGe series metal is formed on the contact layer 9. Also, a back electrode 11 of, for example, a AuZn series metal is formed on the back surface of the GaP substrate 1 opposite to the interface with the second bonding layer 2.

A predetermined voltage is applied between the front surface electrode 10 and the back surface electrode 11 of the semiconductor light-emitting device of the construction described above so as to allow the light-emitting layer 7 to emit light.

Figure 2A:
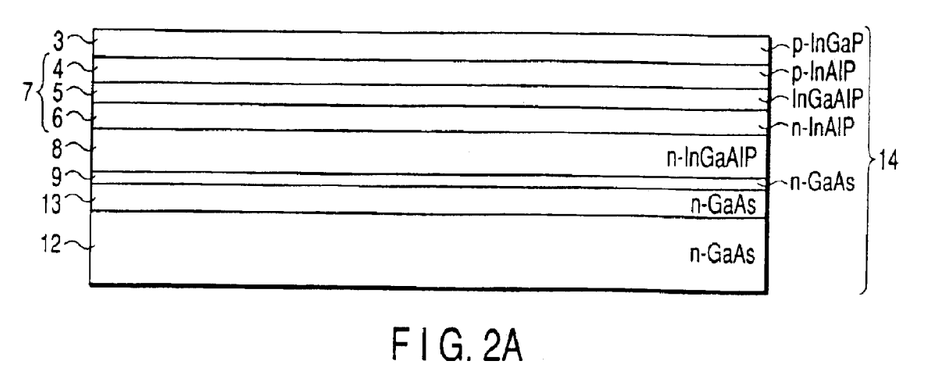
FIGS. 2A and 2B are cross sectional views collectively showing a method of manufacturing a semiconductor light-emitting device according to the first embodiment of the present invention.
Figure 2B:
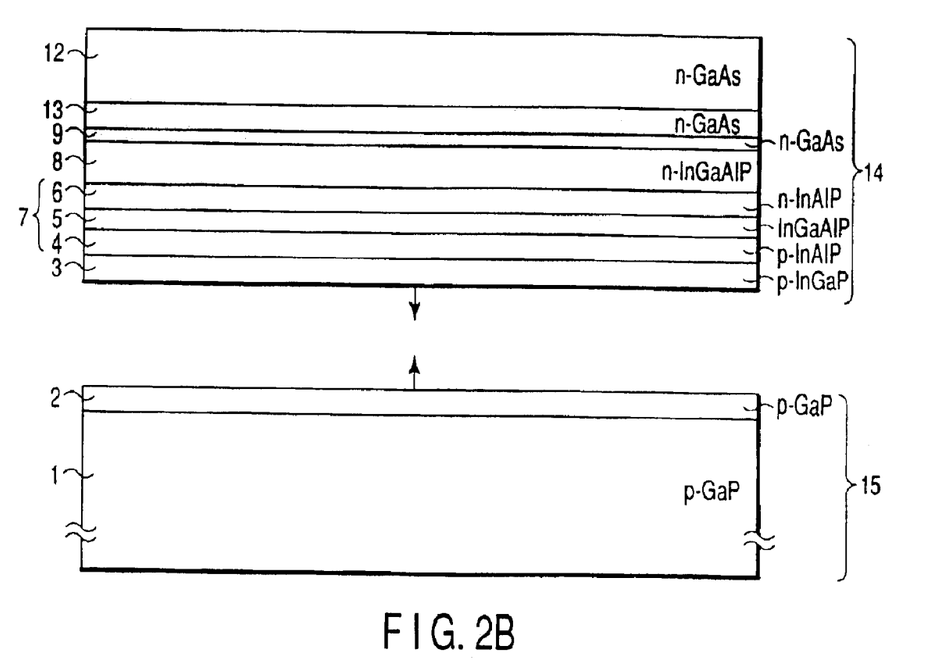

FIGS. 2A and 2B collectively show a method of manufacturing the semiconductor light-emitting device of the construction described above. Throughout FIGS. 1, 2A and 2B, the same constituents of the light-emitting device are denoted by the same reference numerals. The manufacturing method of the semiconductor light-emitting device will now be described with reference to FIGS. 2A and 2B.

FIG. 2A shows an n-type GaAs substrate 12 having a thickness of 250 μm. The planar direction of the n-type GaAs substrate 12 is inclined by 7 to 16° from the (100) face toward the [011] direction. In other words, the planar direction of the n-type GaAs substrate 12 is inclined by the same angle in the direction opposite to the planar direction of the GaP substrate 1 referred to previously. As shown in FIG. 2A, a buffer layer 13 formed of an n-type GaAs is formed on the GaAs substrate 12 by an epitaxial growth method utilizing MOCVD. The buffer layer 13 has a thickness of 0.5 μm.

The MOCVD is performed by using, for example, an organic metal such as TMG (trimethyl gallium), TMA (trimethyl aluminum), or TMI (trimethyl indium), or a hydride gas such as an arsine gas or a phosphine gas. Also, the MOCVD is performed at about 700° C. The MOCVD is performed in other steps under the same conditions and by using the same materials.

The contact layer 9, the current diffusion layer 8 and the n-type cladding layer 6 are successively formed on the GaAs buffer layer 13 by the epitaxial growth method utilizing the MOCVD. Then, the contact layer 9, the current diffusion layer 8 and the n-type cladding layer 6 are doped with, for example, silicon as an impurity. Used as the source of silicon is, for example, silane. Incidentally, it is desirable for the Al content of the current diffusion layer 8 to fall within a range of between 2 and 10%.

Then, the active layer 5 is formed by the MOCVD on the n-type cladding layer 6. The composition of the active layer 5 is determined in accordance with the wavelength of the light to be emitted. To be more specific, the light of red, orange, yellow, yellowish green or green can be obtained by suitably changing the balance of Ga and Al in the InGaAlP composition.

Further, the p-type cladding layer 4 and the second bonding layer 3 are successively by the MOCVD method on the active layer 5, followed by forming a first semiconductor layer (first wafer) 14 by doping the p-type cladding layer 4 and the second bonding layer 3 with zinc using, for example, DMZ (dimethyl zinc) as the doping material. It is necessary to set the impurity concentration in the second bonding layer 3 to fall within a range of between $1 \times 10^{18}$ cm$^{-3}$ and $1 \times 10^{19}$ cm$^{-3}$. The optimum value of the impurity concentration in the first bonding layer 3 is, for example, 3 to $4 \times 10^{18}$ cm$^{-3}$.

As shown in FIG. 2B, the first bonding layer 2 is formed on the GaP substrate 1 by the MOCVD method using, for example, TMG and phosphine, followed by doping the first bonding layer 2 with zinc using DMZ as a doping material. It is necessary to set the impurity concentration in the first bonding layer 2 to fall within a range of between $1 \times 10^{18}$ cm$^{-3}$ and $1 \times 10^{19}$ cm$^{-3}$. The optimum impurity concentration in the first bonding layer is, for example, 3 to $4 \times 10^{18}$ cm$^{-3}$. Then, a second semiconductor layer (second wafer) 15 is obtained.

In the embodiment described above, the first bonding layer 2 is formed of p-type GaP. Alternatively, it is also possible to use AlGaP, which is a mixed crystal of AlP and GaP, for forming the first bonding layer 2. It is also possible for the first bonding layer 2 to be of a laminate structure consisting of a plurality of GaP layers and a plurality of AlGaP layers laminated one upon the other.

In the next step, the first semiconductor layer 14 is bonded to the second semiconductor layer 15 at room temperature such that the first bonding layer 2 and the second bonding layer 3 collectively form a bonding interface. Then, a heat treatment is performed at about 500° C. to 700° C. under an inert gas atmosphere so as to achieve a strong bonding between the first semiconductor layer 14 and the second semiconductor layer 15.

Then, the GaAs substrate 12 and the buffer layer 13 are removed by a mechanical polishing and an etching. Further, an AuGe series metal is deposited on the contact layer 9, followed by processing the deposited metal layer by a lithography process so as to form the front surface electrode 10. Likewise, an AuZn series metal is deposited on the GaP substrate 1, followed by processing the deposited metal layer by the lithography process so as to form the back surface electrode 11a.

Figure 3:
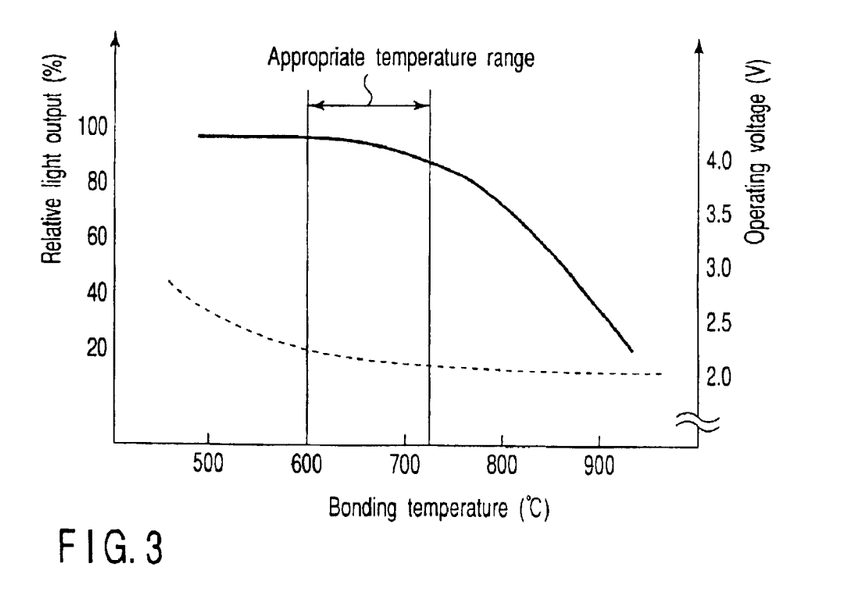
FIG. 3 is a graph showing the relationship between the bonding temperature and the operating voltage and the relationship between the bonding temperature and the relative light output in respect of the semiconductor light-emitting device shown in FIG. 1.

FIG. 3 is a graph showing the relationship between the heat treating temperature in the bonding step and the relative light output of the device and the relationship between the heat treating temperature in the bonding step and the operating voltage in respect of the semiconductor light-emitting device according to the first embodiment of the present invention described above. The solid line in FIG. 3 denotes the relationship between the bonding temperature and the relative light output. On the other hand, the broken line in FIG. 3 denotes the relationship between the bonding temperature and the operating voltage. As apparent from the broken line shown in FIG. 3, the operating voltage is low even when the heat treatment is performed with a relatively low bonding temperature. In other words, it is possible to realize a low operating voltage without lowering the light output. It follows that the appropriate bonding temperature is about 600 to 700° C., as seen from FIG. 3.

According to the first embodiment of the present invention described above, the light-emitting layer 7 is bonded to the GaP substrate 1 with the first bonding layer 2 and the second bonding layer 3 interposed therebetween. Therefore, it is possible to carry out the bonding by the heat treatment performed at about 500 to 700° C., which is lower than that in the prior art. It follows that it is possible to suppress the diffusion of zinc contained in the p-type cladding layer 4 into the active layer 5, the diffusion being caused by the-heat treatment, so as to prevent the crystallinity from being deteriorated. Therefore, it is possible to obtain a sufficient light amount so as to realize a semiconductor light-emitting device having a high output. What should also be noted is that it is possible to carry out the heat treatment at about 500 to 700° C. in the present invention though it was necessary in the prior art to control the temperature for the heat treatment to fall within a narrow range of about 800° C. It follows that the heat treating temperature can be controlled easily in the present invention so as to prevent the yield from being lowered.

Figure 4A:
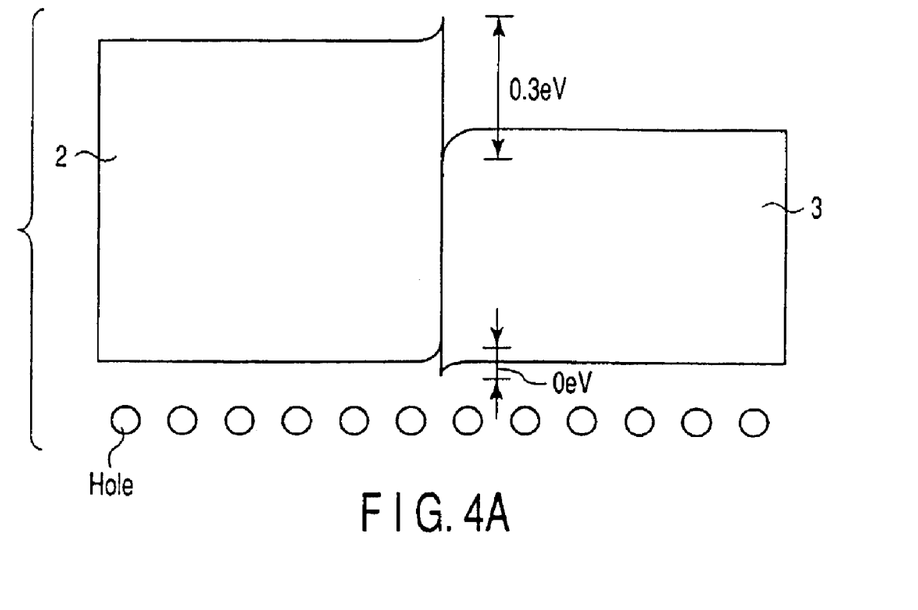
FIGS. 4A and 4B are cross sectional views collectively showing the band structure of the semiconductor light-emitting device according to the first embodiment of the present invention.
Figure 4B:
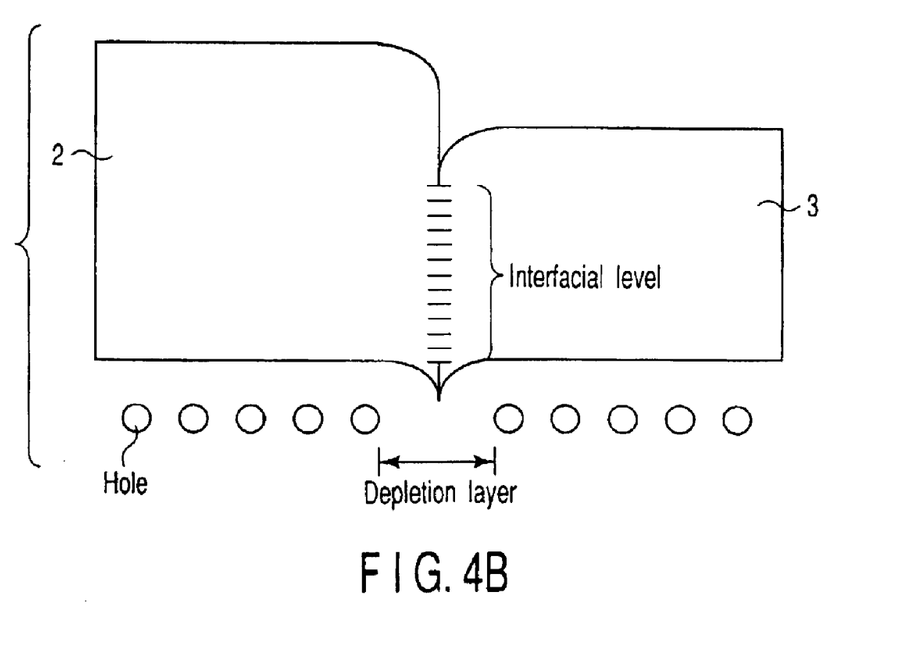
Figure 5:
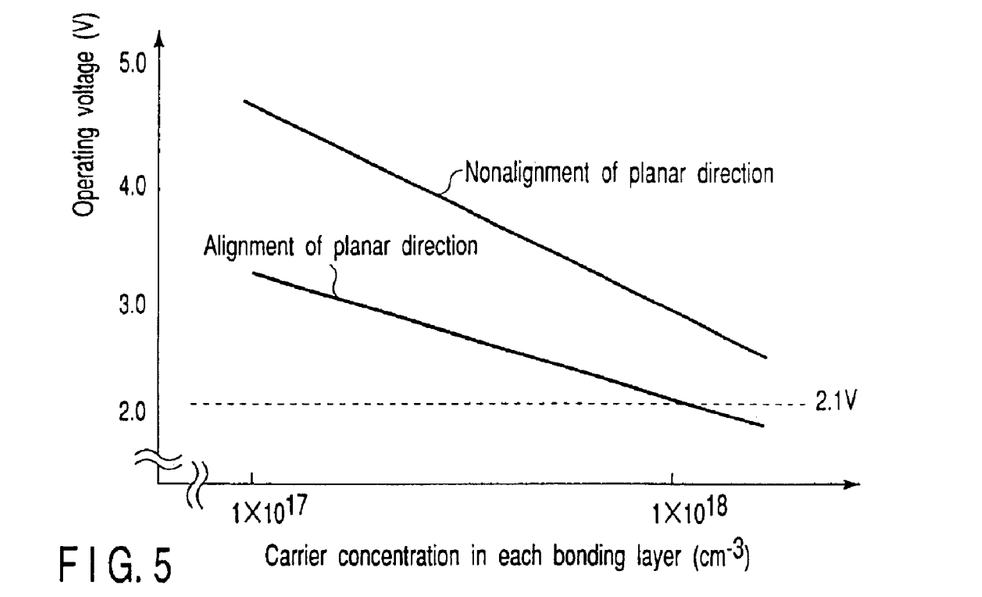
FIG. 5 is a graph showing the relationship between the carrier concentration in each of the first and second bonding layers and the operating voltage.

The effect of the lattice alignment at the interface between the first bonding layer 2 and the second bonding layer 3 will now be described with reference to FIGS. 4 and 5. FIG. 4A shows the band structure of the first and second bonding layers 2 and 3 shown in FIG. 1.

Where different materials are bonded to each other (hetero bonding), the construction of the bonding portions of these materials is important in general. First of all, it is necessary for the bonding surfaces to be flat. In other words, it is important for a satisfactory crystal growth low in defect to be carried out. In order to achieve the satisfactory crystal growth, it is necessary for the lattices of the both bonding layers to be aligned with each other.

However, if the lattices of the both layers are aligned with each substrate, the both layers are formed of materials differing from each other in the lattice constant. In general, the band discontinuity takes place in each of the conduction band and the valence bond in the interface of the hetero bond. If the amount of the discontinuity is large, the diffusion of the carrier, i.e., the electrical conduction, is inhibited. This provides the resistance to the current so as to elevate the operating voltage of the device. It follows that it is necessary to select the combination of materials that permits the lattices of the both bonding layers to be aligned with each other and also permits diminishing the discontinuity of the band.

According to the first embodiment of the present invention, a hetero bond is formed by the first bonding layer 2 formed of a p-type GaP and the second bonding layer 3 formed of a p-type InGaP. In this case, the amounts of the band discontinuity of the conduction band and the valence band are 0.3 eV and 0 eV, respectively, as shown in FIG. 4A. In the first embodiment of the present invention, the majority carrier determining the electrical conduction of the first bonding layer 2 and the second bonding layer 3 is the hole and, thus, the holes in the valence band can be migrated between the first bonding layer 2 and the second bonding layer 3 without being obstructed by the band discontinuity. In other words, an ohmic contact of a low resistivity is formed.

However, an ohmic contact of a low resistivity is not necessarily formed even by the combination of the materials described above. FIG. 4B shows the band structure, covering the case where the crystallinity in the bonding interface is poor in FIG. 4A. If the crystallinity in the bonding interface is poor, many interfacial levels are formed, as shown in FIG. 4B. As a result, the carriers (mainly holes) are trapped by the interfacial levels in the vicinity of the bonding interface so as to form a depletion layer in the vicinity of the bonding portion and, thus, to form a barrier wall. The diffusion of the carrier is prevented by the depletion layer and the barrier wall. It follows that, in order to form an ohmic contact of a low resistivity, it is necessary to decrease the interfacial levels, to increase the carrier concentration in the both bonding layers, and to prevent a depletion layer from being formed in the bonding interface even if the carriers are partly trapped by the interfacial level.

Also, in order to suppress the generation of the interfacial level, it is important to decrease the crystal defect in the bonding portion. Since the lattice of the first bonding layer 2 is not aligned with the lattice of the second bonding layer 3, it is impossible to eliminate completely the defect. However, if the directions of the crystal faces on the bonding surfaces are aligned, it is possible to decrease the interfacial level caused by, for example, the dangling bond at the bonding interface.

Under the circumstances, in the first embodiment of the present invention, the second bonding layer 3 is formed on the GaAs substrate 12 inclining by 7 to 16° from the (100) face toward the [011] direction, and the first bonding layer 2 is formed on the GaP substrate 1 inclining by 7 to 16° from the (−100) face toward the [0-1-1] direction. Since the bonding interface is formed by bonding the first bonding layer 2 and the second bonding layer 3 thus formed, the face directions of the crystals of the both bonding layers are aligned with each other. It follows that it is possible to decrease the trapping of the carriers by the interfacial level in the bonding interface so as to improve the light-emitting efficiency.

It should also be noted that, in the first embodiment of the present invention, the carrier concentration in each of the first bonding layer 2 and the second bonding layer 3 is set at $1 \times 10^{18}$ cm$^{-3}$ or more. As a result, it is possible to prevent a depletion layer from being formed in the bonding interface. It follows that it is possible to lower the operating voltage, as apparent from FIG. 5 showing the relationship between the carrier concentration in each of the first and second bonding layers and the operating voltage. Further, by allowing the face directions to be aligned with each other, it is possible to further lower the operating voltage to 2.1V or lower, compared with the case where the face directions are not aligned with each other.

Figure 6:
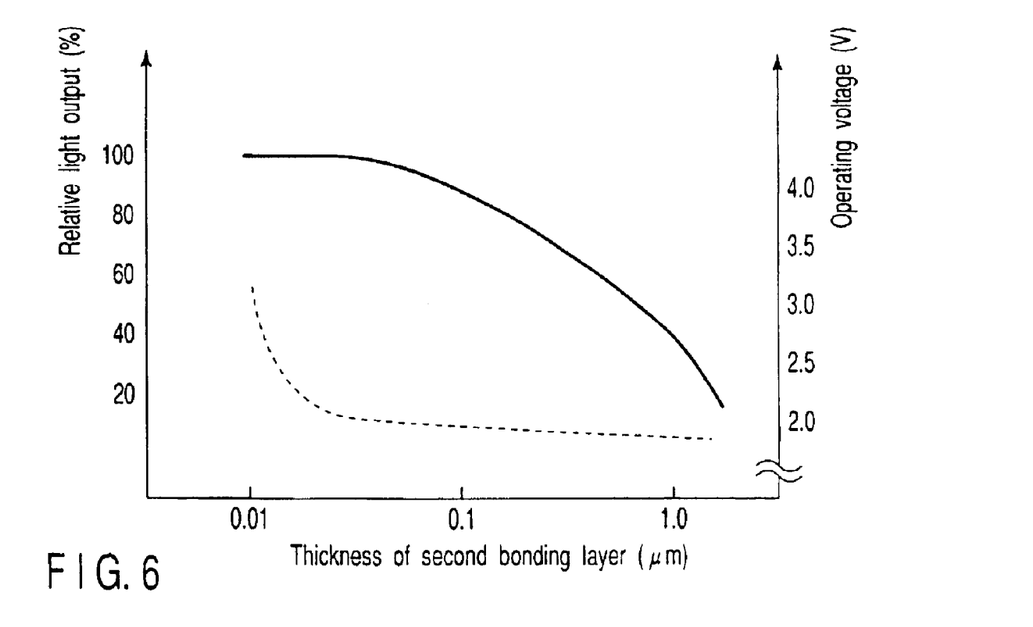
FIG. 6 is a graph showing the relationship between the thickness of the second bonding layer and the relative light output and the relationship between the thickness of the first bonding layer and the operating voltage.

The relationship between the thickness of the second bonding layer 3 and the relative light output and the relationship between the thickness of the second bonding layer 3 and the operating voltage will now be described. FIG. 6 is a graph showing the relationship between the thickness of the second bonding layer 3 and the relative light output and the relationship between the thickness of the second bonding layer 3 and the operating voltage. The solid line in FIG. 6 denotes the relationship between the thickness of the second bonding layer 3 and the relative light output, and the broken line denotes the relationship between the thickness of the second bonding layer 3 and the operating voltage. As apparent from the solid line in FIG. 6, the light emitted from the active layer 5 is absorbed so as to lower the light output, if the second bonding layer 3 is excessively thick to fall within a range of between 0.1 μm and 1 μm. Clearly, it is desirable for the second bonding layer 3 to be thin. However, if the second bonding layer 3 is excessively thin, i.e., not thicker than 0.03 μm, the operating voltage is elevated as denoted by the broken line shown in FIG. 6. It follows that it is optimum for the thickness of the second bonding layer 3 to fall within a range of between about 0.03 μm and about 0.1 μm. Where the thickness of the second bonding layer 3 falls within the range noted above, it is possible to increase the light output and to lower the operating voltage of the semiconductor light-emitting device.

Further, in the first embodiment of the present invention, the Al content of the current diffusion layer 8 is defined to fall within a range of, for example, between 2% and 7%. As described previously, the current diffusion layer 8 is formed of InGaAlP. In this case, it is desirable for the Ga content of the current diffusion layer 8 to be as low as possible. If the Ga content is lowered, however, the Al content is increased so as to increase the resistivity, resulting in failure to obtain a sufficient current diffusion effect. Under the circumstances, the Al content of the current diffusion layer is controlled to fall within a range of, for example, between 2% and 7% so as to obtain a sufficient current diffusion effect.

(Second Embodiment)

Figure 7:
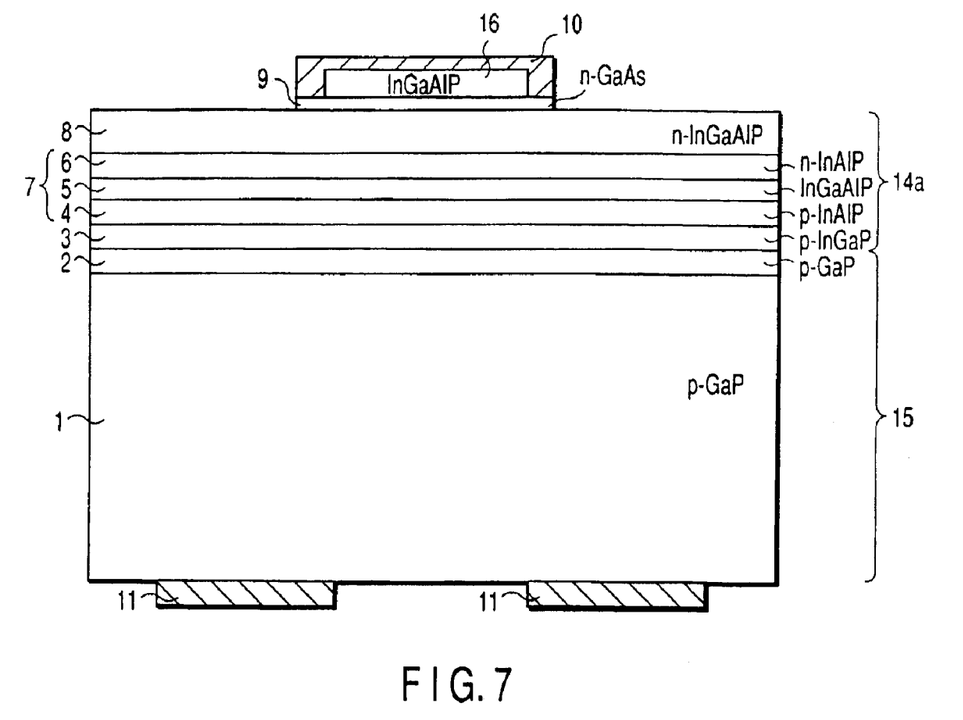
FIG. 7 is a cross sectional view showing the construction of a semiconductor light-emitting device according to a second embodiment of the present invention.

FIG. 7 shows the construction of a semiconductor light-emitting device according to a second embodiment of the present invention. In FIGS. 1 and 7, the same constituents of the light-emitting device are denoted by the same reference numerals so as to avoid an overlapping description.

FIG. 7 shows a current blocking layer 16 formed of InGaAlP. The current blocking layer 16 is formed after deposition of the buffer layer 13 shown in FIG. 2A. To be more specific, an InGaAlP layer is deposited on the buffer layer 13, followed by successively depositing the contact layer 9, etc. on the InGaAlP layer. Then, a first semiconductor layer 14a is bonded to the second semiconductor layer 15, followed by removing the GaAs substrate 12 and the buffer layer 13. Further, the current blocking layer 16 formed of the InGaAlP layer is processed by the photolithography process, followed by depositing a AuGa series metal so as to form the front surface electrode 10.

The particular construction described above permits producing the effect similar to that produced by the first embodiment. Further, in the second embodiment of the present invention, the current blocking layer 16 is formed inside the front surface electrode 10 so as to prevent the current from flowing right under the front surface electrode 10, thereby suppressing the light emission from a region right under the front surface electrode. It follows that it is possible to avoid the absorption of the light by the front surface electrode 10, thereby increasing the light output.

(Third Embodiment)

Figure 8:
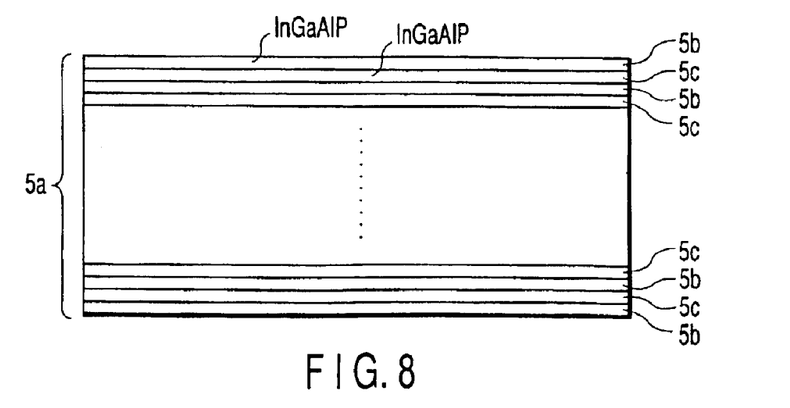
FIG. 8 is a cross sectional view showing the construction of an active layer of a multiple quantum well structure according to a third embodiment of the present invention.

The third embodiment is a modification of the second embodiment. In the third embodiment of the present invention, the active layer 5 shown in FIG. 7 is of a multiple quantum well structure. As shown in FIG. 8, an active layer 5a of the multiple quantum well structure is formed by alternately depositing InGaAlP layers 5b each having a thickness of 5 nm and containing 15% of Al and InGaAlP layers 5c each having a thickness of 8 nm and containing 2.5% of Al. For example, 41 InGaAlP layers 5b and 40 InGaAlP layers 5c are alternately deposited one upon the other so as to form the active layer 5a of the multiple quantum well structure.

According to the third embodiment of the present invention described above, a multiple quantum well structure is employed for forming the active layer 5 so as to realize a semiconductor light-emitting device having an output higher than that in any of the first and second embodiments described previously.

Figure 9:
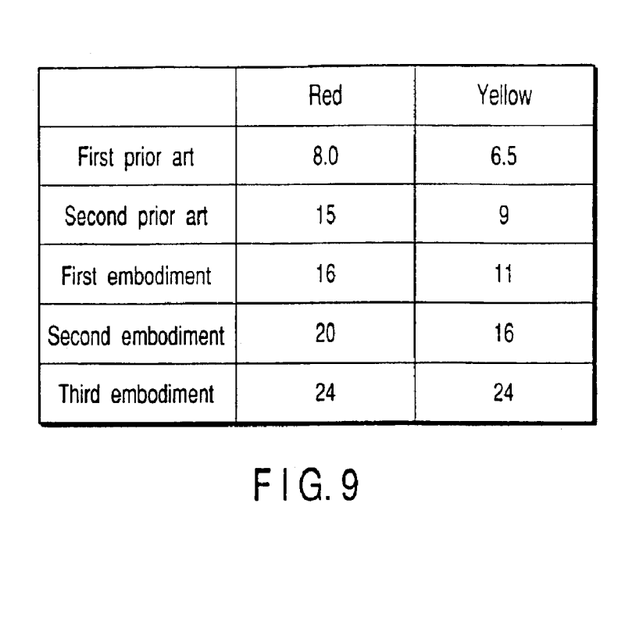
FIG. 9 is a table showing the light-emitting efficiencies in respect of the conventional semiconductor light-emitting devices and the semiconductor light-emitting devices according to some embodiments of the present invention.

FIG. 9 is a table showing the light-emitting efficiency of the semiconductor light-emitting device for the prior art and for the third embodiment of the present invention in respect of LED's emitting light of typical colors of, for example, red and yellow. As shown in FIG. 9, the third embodiment of the present invention provides a semiconductor light-emitting device having a light-emitting efficiency higher than that for the prior art for each color.

(Fourth Embodiment)

In each of the first to third embodiments of the present invention described above, a light-emitting layer including an n-type cladding layer, an active layer and a p-type cladding layer, which are formed in the order mentioned as viewed from the lower side, is formed on an n-type GaAs substrate, and a p-type GaP substrate is bonded to the p-type cladding layer included in the light-emitting layer. However, it is generally difficult to obtain a p-type GaP used for forming the substrate. Also, it is difficult to prevent the p-type impurity from being diffused into the active layer in bonding the p-type GaP substrate. Such being the situation, in the fourth embodiment of the present invention, employed is a so-called "pn inversion structure", in which a p-type cladding layer included in the light-emitting layer is formed on an n-type GaAs substrate. Further, an n-type GaP substrate is bonded to the light-emitting layer.

Figure 10:
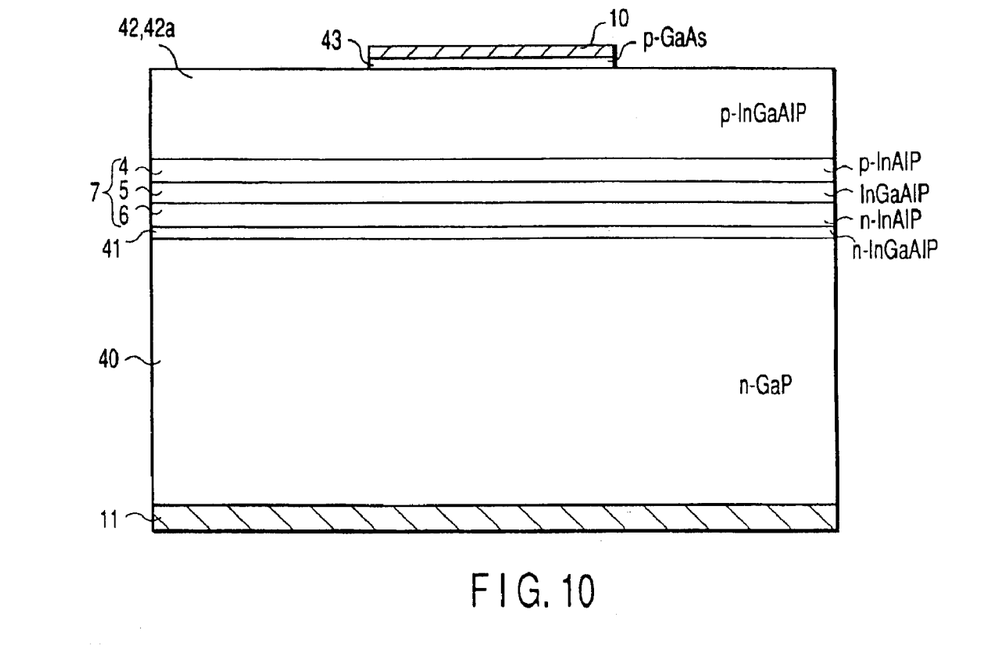
FIG. 10 is a cross sectional view showing the construction of a semiconductor light-emitting device according to a fourth embodiment of the present invention.

FIG. 10 shows the construction of a semiconductor light-emitting device according to the fourth embodiment of the present invention. As shown in the drawing, the semiconductor light-emitting device according to the fourth embodiment includes an n-type GaP substrate 40 having a thickness of, for example, 250 μm. A bonding layer 41 formed of an n-type InGaAlP layer having a thickness of, for example, 0.05 μm is formed on the n-type GaP substrate 40. Further, the n-type cladding layer 6, the active layer 5 and the p-type cladding layer 4 are successively formed on the bonding layer 41. Each of the n-type cladding layer 6 and the p-type cladding layer 4 has a thickness of, for example, 1.0 μm, and the active layer 5 has a thickness of, for example, 0.5 μm.

A current diffusion layer 42 consisting of a p-type InGaAlP layer having a thickness of, for example, 3.0 μm is formed on the p-type cladding layer 4. Also, a contact layer 43 consisting of a p-type GaAs layer having a thickness of, for example, 0.01 μm is formed on the current diffusion layer 42. Reference numerals 10 and 11 shown in FIG. 10 denote the front surface electrode and the back surface electrode, respectively. Incidentally, a reference numeral 42a shown in FIG. 10 will be referred to herein later in conjunction with a fifth embodiment of the present invention.

Figure 11A:
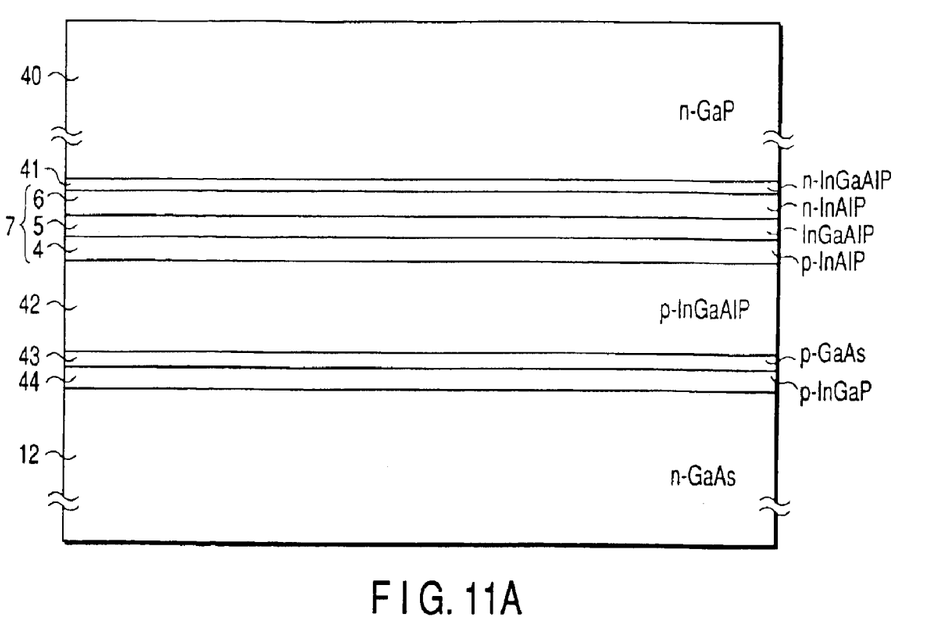
FIGS. 11A and 11B are cross sectional views collectively showing a method of manufacturing the semiconductor light-emitting device according to the fourth embodiment of the present invention.
Figure 11B:
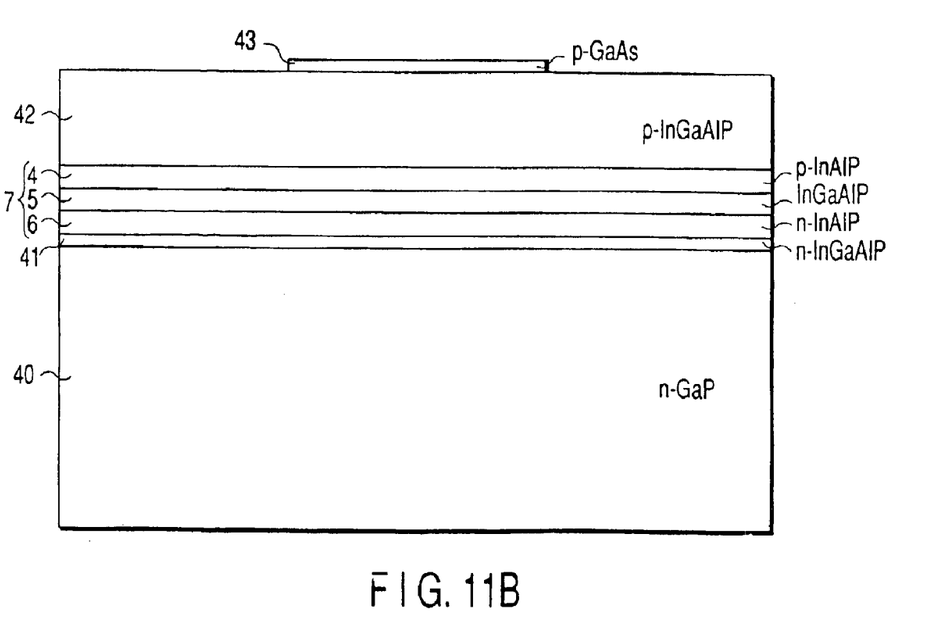

FIGS. 11A and 11B collectively show the method of manufacturing the semiconductor light-emitting device of the construction described above. Throughout FIGS. 2, 10, 11A and 11B, the same constituents of the semiconductor light-emitting device are denoted by the same reference numerals. The manufacturing method of the semiconductor light-emitting device according to the fourth embodiment of the present invention will now be described with reference to FIGS. 11A and 11B.

As shown in FIG. 11A, the n-type GaAs substrate 12 is cleaned by an organic solvent or a sulfuric acid series etchant. Then, after the n-type GaAs substrate 12 is heated to, for example, 700° C. as in the first embodiment, an etching stopper layer 44 consisting of a p-type InGaP layer is formed by the MOCVD method on the n-type GaAs substrate 12. The etching stopper layer 44 is used for the selective etching applied in the subsequent step to the n-type GaAs substrate 12.

As in the first embodiment, the MOCVD is performed by using, for example, trimethyl gallium as a Ga source, trimethyl aluminum as an Al source, trimethyl indium as an In source, and phosphine as a P source. Also, monosilane, dimethyl zinc, etc. are used as the n-type impurity and the p-type impurity. This is also the case with the subsequent steps.

In the subsequent steps, the contact layer 43, the current diffusion layer 42, the p-type cladding layer 4, the active layer 5, the n-type cladding layer 6 and the bonding layer 41 are successively formed by the MOCVD method on the etching stopper layer 44. Incidentally, the etching stopper layer 44, the bonding layer 41 and all the layers interposed between these etching stopper layer 44 and bonding layer 41 are formed such that the lattices of these layers are aligned with the lattice of the n-type GaAs substrate 12.

Then, a semiconductor layer consisting of an n-type GaP substrate 40 having a thickness of 250 μm is bonded to the bonding layer 41, followed by removing the n-type GaAs substrate 12 by etching utilizing the etching stopper layer 44 and subsequently removing the etching stopper layer 44.

In the next step, the contact layer 43 is etched to conform with the shape of an electrode, as shown in FIG. 11B. As shown in FIG. 10, the front surface electrode 10 is formed on the contact layer 43. On the other hand, a back surface electrode is formed on the n-type GaP substrate 40. Incidentally, it is possible to deposit an AuGe series metal layer on the contact layer 43, followed by simultaneously etching the contact layer 43 and the deposited metal layer so as to form the front surface electrode.

In the fourth embodiment of the present invention described above, a pn inversion structure forming the light-emitting layer 7 including the p-type cladding layer 4, the active layer 5, and the n-type cladding layer 6, which are formed in the order mentioned as viewed from the lower side, is formed on the n-type GaAs substrate 12, and the n-type GaP semiconductor layer 40 is bonded to the light-emitting layer 7. In forming a light-emitting layer of a conventional pn inversion structure, current is unlikely to flow through the pn junction portion formed between the substrate and the light-emitting layer. In order to avoid this difficulty, used is a p-type GaAs substrate. However, it is known to the art that, in the case of using a p-type GaAs substrate, the acceptor impurity, i.e., zinc in this case, contained in the substrate in a large amount is diffused into the light-emitting layer so as to lower the light-emitting characteristics. Also, in the case of using a p-type GaAs substrate, the impurity is diffused in the heating step for bonding the n-type GaP substrate so as to render the problem more serious.

Under the circumstances, the n-type GaAs substrate is used in place of the p-type GaAs substrate so as to overcome the above-noted problem, as apparent from the fourth embodiment of the present invention described above. Further, the n-type GaAs substrate 12 is removed during the manufacturing process of the semiconductor light-emitting device, with the result that a pn junction portion is not formed. It follows that it is also possible to overcome the problem that current is unlikely to flow through the device.

It should also be noted that the n-type GaP semiconductor layer 40 is used in the fourth embodiment of the present invention. In general, the p-type GaP has an impurity concentration higher than that in the other p-type layer. Since the p-type GaP is not used in the fourth embodiment, it is possible to suppress the problem that the impurity is diffused into the light-emitting layer in the heating process for bonding the n-type GaP semiconductor layer 40 so as to deteriorate the light-emitting characteristics.

Incidentally, in the fourth embodiment of the present invention, the active layer 5 is formed of an InGaAlP layer containing 2.5% of Al. It should be noted that emission of a red light having a peak in 625 nm was observed when a bias voltage was applied between the front surface electrode 10 and the back surface electrode 11. The light output in a package having a radiation angle of 10° was found to be 7.5 cd under the operating current of 20 mA, which was higher than the light output of the semiconductor light-emitting device according to the first embodiment of the present invention.

(Fifth Embodiment)

In the fourth embodiment described above, a p-type InGaAlP is used for forming the current diffusion layer 42. On the other hand, a fifth embodiment of the present invention differs from the fourth embodiment in that a p-type GaAlAs is used for forming the current diffusion layer 42a. Therefore, the fifth embodiment will now be described with reference to FIG. 10 while omitting the description on the portions equal to the fourth embodiment such as the other construction, operation, the manufacturing method, etc. The p-type GaAlAs current diffusion layer 42a shown in FIG. 10 has a thickness of, for example, 3.0 µm.

In general, the current diffusion layer is formed for diffusing the current injected from the electrode into a wide region within the device, as described previously and, thus, it is desirable for the current diffusion layer to have a low resistivity. In the fifth embodiment, a p-type GaAlAs layer containing 35% of Al is used for forming the current diffusion layer and, thus, the resistivity of the current diffusion layer for the fifth embodiment is lower than that of the current diffusion layer for the fourth embodiment formed of a p-type InGaAlP.

Figure 12:
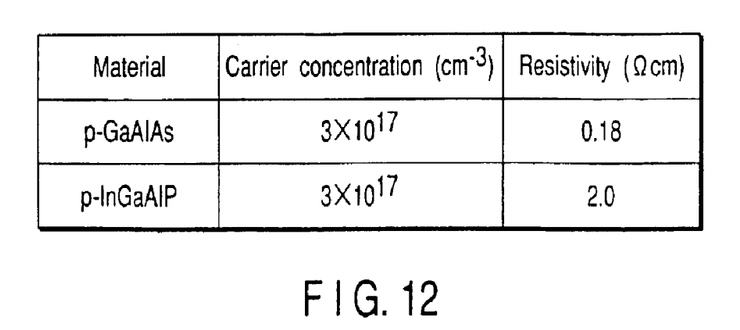
FIG. 12 is a table showing the carrier concentration and the resistivity in the current diffusion layer formed of each material.

FIG. 12 is a table showing the carrier concentration and the resistivity for each of the p-type GaAlAs and the p-type InGaAlP. As shown in FIG. 12, the resistivity of the current diffusion layer can be markedly lowered in the case of using GaAlAs for forming the current diffusion layer, compared with the case of using InGaAlP for forming the current diffusion layer. Incidentally, it is possible to further decrease the resistivity by increasing the carrier concentration. However, it is not desirable to increase the carrier (zinc) concentration because zinc is diffused. It is also conceivable to use, for example, GaP for forming the current diffusion layer 42a. However, the lattice of GaAlAs is substantially aligned with the lattice of GaAs used for forming the substrate and, thus, is not affected by the propagation of the lattice defect into the active layer 7. It follows that it is highly effective to use GaAlAs, not GaP, for forming the current diffusion layer.

In the fifth embodiment of the present invention, the light output in a package having a radiation angle of 10° was found to be 8 cd under the operating current of 20 mA.

According to the fifth embodiment of the present invention, it is possible to lower the resistivity of the current diffusion layer 42a by using GaAlAs for forming the current diffusion layer 42a. As a result, the expansion of the current within the device is increased so as to increase the efficiency of taking out light to the outside of the device.

(Sixth Embodiment)

In each of the first to fifth embodiments described above, an n-type layer formed the lower side of the device. On the other hand, a sixth embodiment of the present invention differs from the other embodiment in that a p-type layer forms the lower side of the device, and is equal to the first to fifth embodiments in the other portions.

Figure 13:
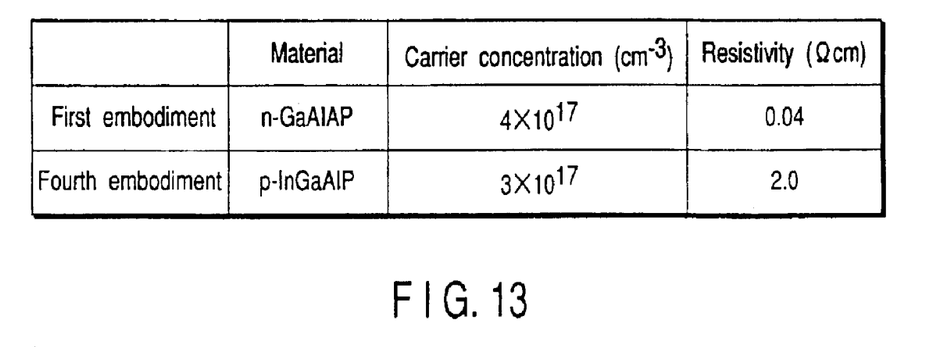
FIG. 13 is a table showing the carrier concentration and the resistivity in the current diffusion layer formed of each material.

FIG. 13 is a table showing the carrier concentration and the resistivity of the current diffusion layer for each of the first and fourth embodiments of the present invention. As shown in FIG. 13, the current diffusion layer for the fourth embodiment is inferior in resistivity to that for the first embodiment. What should be noted is that the p-type layer and the n-type layer widely differ from each other in resistivity, where these p-type and n-type layers are formed of the same semiconductor material. Clearly, the p-type layer is disadvantageous over the n-type layer in terms of the current diffusing function.

Figure 14:
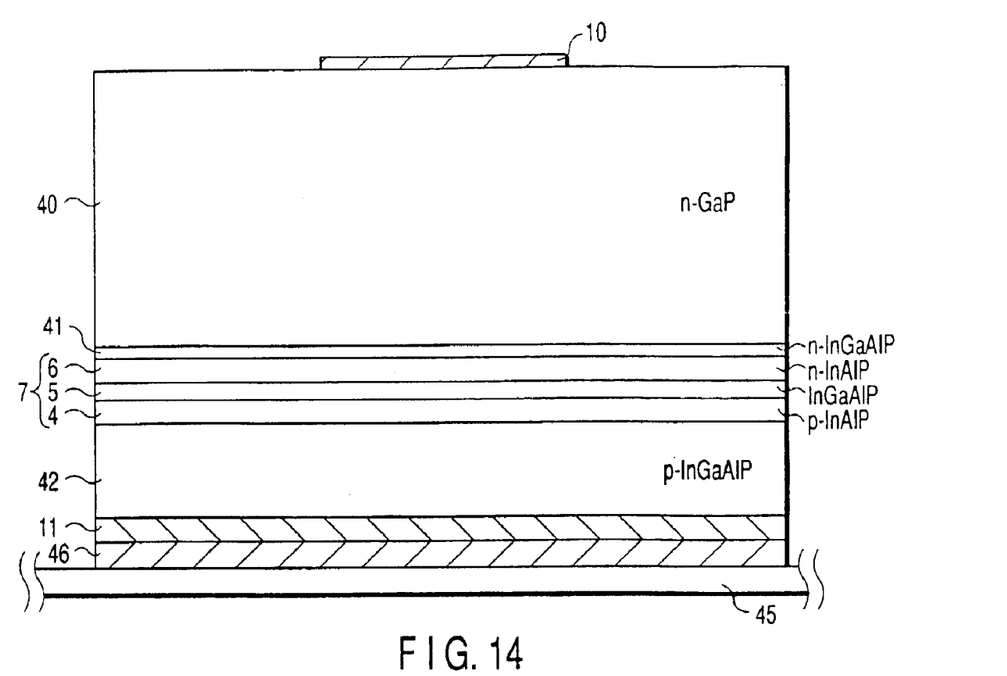
FIG. 14 is a cross sectional view showing the construction of a semiconductor light-emitting device according to a sixth embodiment of the present invention.

FIG. 14 shows the construction of a semiconductor light-emitting device according to a sixth embodiment of the present invention. As shown in the drawing, the back surface electrode 11 used as a p-type side electrode is formed on the entire surface of the current diffusion layer 42, and the light is taken out mainly from the side of the n-type side electrode. In other words, the back surface electrode 11 is formed on the current diffusion layer 42 after removal of the contact layer 43. As a result, the current injected from the back surface electrode 11 is diffused over the entire region within the device.

It should also be noted that, when it comes to an Ag paste used as a mounting material, the Ag paste is upheaved onto the side surface of the device in the mounting step so as to bring about a short circuit. To overcome the difficulty, the mounting is performed by utilizing an eutectic electrode consisting of a mount layer 45 made of AuSn and arranged on the mount surface and an electrode layer 46 made of, for example, a Au series metal and formed on the back surface electrode 11.

If a bias voltage is applied across the semiconductor light-emitting device of the construction described above, it is possible to confirm the light emission from the entire region on the surface of the device. It is also possible to take out the light effectively from the side surface region closed in the prior art by the upheaval of the Ag paste. The light output in a package having a radiation angle of 10° was found to be 10 cd under the operating current of 20 mA.

According to the sixth embodiment of the present invention, the current diffusion layer 42 is formed on the side opposite to the side on which the light is taken out so as to make it possible to form the back surface electrode 11 on the entire surface. As a result, it is possible to expand the current over the entire region within the device. Also, since the eutectic electrode using AuSn is used for mounting the device to the mount layer 45, it is possible to take out the light effectively from the side surface region of the device, too, so as to improve the light output of the device.

In each of the fourth to sixth embodiments of the present invention described above, the active layer 5 is formed of a single crystal. However, it is also possible for the active layer 5 to be of a multiple quantum well structure as in, for example, the third embodiment. In this case, the light output can be further increased. Also, since a large number of interfaces are present, the structure is rendered strong against the impurity diffusion.

It should also be noted that the back surface electrode is not limited to the construction of the ohmic electrode in each of the embodiments described above. For example, it is possible to form a metal film having the reflection characteristics enhanced partially. Further, it is possible to take out effectively the light emitted from the active layer 7 toward the back surface electrode to the outside of the device.

Also, in each of the embodiments described above, the n-type GaP semiconductor layer 40 was bonded to the bonding layer 41. Alternatively, the n-type GaP semiconductor layer 40 can be formed by the crystal growth utilizing the MOCVD method.

Further, it is possible to improve the efficiency of taking out the light in also the embodiment, in which there is a problem in the expansion of the current within the current diffusion layer, by using a material transparent to light and facilitating the current flow such as ITO (indium tin oxide) or a thin metal film for forming the electrode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor light-emitting device, comprising:

forming a first semiconductor layer including formation of a buffer layer of a second conductivity type on a second substrate of the second conductivity type, formation of a current diffusion layer of the second conductivity type on said buffer layer, formation of a second cladding layer of the second conductivity type on said current diffusion layer, formation of an active layer on said second cladding layer, formation of a first cladding layer of a first conductivity type on said active layer, and formation of a second bonding layer of the first conductivity type on said first cladding layer, each of said second substrate and said buffer layer consisting essentially of a GaAs material, each of said current diffusion layer, said active layer and said first and second cladding layers consisting essentially of a material represented by a general formula $In_xGa_yAl_zP$, where $x+y+z=1$, and $0 \leq x, y, z \leq 1$, and said second bonding layer consisting essentially of an InGaP material;

forming a second semiconductor layer including formation of a first bonding layer of the first conductivity type on a first substrate of the first conductivity type, each of said first substrate and said first bonding layer consisting essentially of a GaP material;

bonding said first semiconductor layer to said second semiconductor layer with said first bonding layer and said second bonding layer forming a bonding interface; and removing said second substrate and buffer layer.

2. The method of manufacturing a semiconductor light-emitting device according to claim 1, wherein the planar direction of said second substrate is inclined by 7 to 16° from the (100) face toward the [011] direction and, and the planar direction of said first substrate is inclined by 7 to 16° from the (−100) face toward the [0-1-1] direction.

3. The method of manufacturing a semiconductor light-emitting device according to claim 1, wherein each of said first and second bonding layers has an impurity concentration falling within a range of between $1 \times 10^{18}$ cm$^{-3}$ and $1 \times 10^{19}$ cm$^{-3}$.

4. The method of manufacturing a semiconductor light-emitting device according to claim 1, wherein formation of said first semiconductor layer further comprises forming a current blocking layer on said buffer layer before formation of said current diffusion layer, and said current blocking layer consisting essentially of a material represented by a general formula $In_xGa_yAl_zP$, where $x+y+z=1$, and $0 \leq x, y, z \leq 1$.

5. A method of manufacturing a semiconductor light-emitting device, comprising:

forming a p-type etching stopper layer on an n-type semiconductor substrate consisting essentially of a GaAs, said etching stopper layer consisting essentially of a material represented by a general formula $In_xGa_yAl_zP$, where $x+y+z=1$, and $0 \leq x, y, z \leq 1$;

forming a p-type contact layer on said etching stopper layer, said contact layer consisting essentially of GaAs;

forming a p-type current diffusion layer on said contact layer, said current diffusion layer consisting essentially of a material selected from the group consisting of InGaAlP and GaAlAs;

forming a p-type first cladding layer on said current diffusion layer, said first cladding layer consisting essentially of a material represented by a general formula $In_xGa_yAl_zP$, where $x+y+z=1$, and $0 \leq x, y, z \leq 1$;

forming an active layer on said first cladding layer, said active layer consisting essentially of a material represented by a general formula $In_xGa_yAl_zP$, where $x+y+z=1$, and $0 \leq x, y, z \leq 1$;

forming an n-type second cladding layer on said active layer, said second cladding layer consisting essentially of a material represented by a general formula $In_xGa_yAl_zP$, where $x+y+z=1$, and $0 \leq x, y, z \leq 1$;

forming an n-type bonding layer on said second cladding layer said bonding layer consisting essentially of a material represented by a general formula $In_xGa_yAl_zP$, where x+y+z=1, and $0 \leq x, y, z \leq 1$;

forming an n-type semiconductor layer on said bonding layer, said semiconductor layer consisting essentially of a GaP material; and removing said semiconductor substrate and said etching stopper layer.

6. The method of manufacturing a semiconductor light-emitting device according to claim 5, further comprising:

removing said contact layer after removal of said semiconductor substrate and said etching stopper layer;

forming an electrode on said current diffusion layer;

forming a conductive electrode layer on said electrode;

arranging said electrode layer on a conductive mount layer; and converting said electrode layer and said mount layer into a eutectic structure.

7. The method of manufacturing a semiconductor light-emitting device according to claim 5, wherein said semiconductor layer is bonded to said bonding layer.

8. The method of manufacturing a semiconductor light-emitting device according to claim 5, wherein said semiconductor layer is formed by crystal growth on said bonding layer.

9. The method of manufacturing a semiconductor light-emitting device according to any one of claims 1 to 8, wherein said active layer is of a multiple quantum well structure.

* * * * *